US010148231B2

(12) United States Patent
Hussein et al.

(10) Patent No.: US 10,148,231 B2
(45) Date of Patent: Dec. 4, 2018

(54) RF POWER AMPLIFIER WITH DYNAMIC IMPEDANCE MATCHING THROUGH DISCRETE PRESETS AND/OR A VARIABLE POWER SUPPLY

(71) Applicant: Analogic Corporation, Peabody, MA (US)

(72) Inventors: Ahmed A. Hussein, Peabody, MA (US); Gerald A. Brimmer, North Andover, MA (US); Robert G. Haefner, Jr., Haverhill, MA (US); Matthew Hanlon, Kingston, NH (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 15/181,523

(22) Filed: Jun. 14, 2016

(65) Prior Publication Data

US 2017/0359034 A1 Dec. 14, 2017

(51) Int. Cl.
| H03F 1/56 | (2006.01) |
| H03F 3/19 | (2006.01) |
| H03F 3/21 | (2006.01) |
| G01R 33/36 | (2006.01) |

(52) U.S. Cl.
CPC .......... *H03F 1/56* (2013.01); *G01R 33/3614* (2013.01); *H03F 3/19* (2013.01); *H03F 3/21* (2013.01); *H03F 2200/451* (2013.01)

(58) Field of Classification Search
USPC ........ 330/302–306, 297, 127, 129, 134, 279
See application file for complete search history.

(56) References Cited

U.S. PATENT DOCUMENTS

| 4,827,219 A | 5/1989 | Harrison | |
| 5,483,158 A | 1/1996 | Heteren | |
| 6,349,216 B1* | 2/2002 | Alberth, Jr. | ........... H03F 1/0222 375/296 |
| 8,604,791 B2 | 12/2013 | Vaughn | |
| 9,197,255 B2* | 11/2015 | Pourkhaatoun | ......... H03F 3/195 |
| 9,325,282 B2* | 4/2016 | Bowers | ................... H03F 3/195 |

FOREIGN PATENT DOCUMENTS

WO 2013008116 A1 1/2013

\* cited by examiner

*Primary Examiner* — Hieu Nguyen
(74) *Attorney, Agent, or Firm* — TraskBritt (57) ABSTRACT

An apparatus includes an RF power amplifier with a controller and an impedance matching network. The RF power amplifier is configured to drive a load in electrical communication with the RF power amplifier. The impedance matching network is located electrically between the RF power amplifier and the load. The impedance matching network is configured to match an output impedance of the RF power amplifier and an impedance of the load. The impedance matching network includes a set of fixed value impedance matching circuits configured to provide different discrete values. The RF amplifier includes a variable DC power supply powering RF transistors to result in a variable output impedance for the amplifier. The controller selects an impedance matching circuit of the capacitor presets and/or the right setting for the variable DC supply that result in minimum reflected power to match the output impedance of the amplifier to the output load impedance.

16 Claims, 10 Drawing Sheets

RF POWER AMPLIFIER WITH DYNAMIC IMPEDANCE MATCHING THROUGH DISCRETE PRESETS AND/OR A VARIABLE POWER SUPPLY

TECHNICAL FIELD

The following generally relates to a Radio Frequency (RF) power amplifier and more particularly an RF power amplifier with dynamic impedance matching, and is described with particular application to Magnetic Resonance Imaging (MRI); however, the following is also amenable to other applications, including semiconductor applications such as impedance matching to plasma load, and/or other applications with an RF power amplifier.

BACKGROUND

A magnetic resonance imaging system generally includes a main magnet, gradient coils (x, y and z), an RF amplifier, an RF transmit coil, and an RF receive coil. The main magnet polarizes protons in tissue in a human or animal subject in an examination region. The gradient coils localize and spatially encode the positions of the protons. The RF amplifier produces an RF signal which causes the RF transmit coil to transmit RF pulses that excite protons in the subject. The RF receive coil receives a Magnetic Resonance (MR) signal produced in response to the protons returning to the pre-excite state. The received MR signal is processed to generate an image.

The finite conductivity of anatomical tissue of the human or animal subject causes losses as the RF pulses are transmitted into the anatomical tissue. This energy loss (as resistive Ohmic losses) in the body tissue decreases the Q of the MRI coil, which necessitates increasing the power requirement to generate a given magnetic field. As the mass inside the RF transmit coil varies from subject to subject, so will the resistive losses and so will the Q of the coil. As such, the load impedance the RF amplifier sees may be different from a 50-Ohm load for certain subjects (e.g., as high as 4:1 Voltage Standing Wave Ratio (VSWR) impedance mismatch for a child subject).

A similar load mismatch situation occurs in a two-channel MRI system where an interaction between the two channels (the two MRI coils) takes place and feeds/couples back to the two RF amplifiers feeding the two channels. Unfortunately, the interaction between the two channels may require isolators/circulators to prevent the two RF amplifiers from interacting together and to protect each channel from the excessive reflected power, or load mismatch at the output of each RF channel. Isolators/circulators tend to be expensive and add components, mass, and cost to the RF amplifier and consequently, to the MRI system.

A load mismatch condition results in wasted reflected power back into the RF power amplifier, which is not used as part of the MRI coil excitation. In both of the above situations, the load impedance mismatch conditions can result in up to, e.g., 36% of reflected power into the RF amplifier. This reflected power into the amplifier will increase the power dissipated into the RF devices used in the amplifier, which will lower the RF amplifier Mean Time Between Failures (MTBF). Increasing the power to compensate for losses may increase the cost (e.g., increase the electric bill) of operating the system. The losses may also limit the maximum output power that could be achieved from the RF amplifier.

SUMMARY

Aspects of the application address the above matters, and others.

In one aspect, an apparatus includes an RF power amplifier and an impedance matching network. The RF power amplifier includes a controller. The RF power amplifier is configured to drive a load in electrical communication with the RF power amplifier. The impedance matching network is located electrically between the RF power amplifier and the load. The impedance matching network is configured to match an output impedance of the RF power amplifier and an impedance of the load. The impedance matching network includes a set of fixed value impedance matching circuits configured to provide different discrete values. The controller selects an impedance matching circuit of the set to match the output impedance of the RF amplifier to the load impedance.

In another aspect, an apparatus includes an RF power amplifier configured to drive a load in electrical therewith. The RF power amplifier includes an impedance/power sensor configured to measure an impedance of the load, a variable DC power supply, and a controller in electrical communication with the sensor and the power supply. The controller varies a level of the variable DC power supply based on the impedance of the load to match an output impedance of the RF power amplifier and the impedance of the load.

In another aspect, a method for matching an output impedance of an RF power amplifier and an impedance of a load of the RF power amplifier includes measuring the impedance of the load and activating one of a plurality of preset fixed value impedance matching circuits to match the output impedance of the amplifier to the load impedance.

Those skilled in the art will recognize still other aspects of the present application upon reading and understanding the attached description.

BRIEF DESCRIPTION OF THE DRAWINGS

The application is illustrated by way of example and not limitation in the figures of the accompanying drawings, in which like references indicate similar elements and in which.

DETAILED DESCRIPTION

Described herein is an impedance matching approach. The impedance matching approach can be used with an MRI system, e.g., to match the output impedance of the RF power amplifier to the load seen by the RF power amplifier. The impedance matching approach can also be used with a multi-channel MRI system where an interaction between the two or more MRI coils feeds/couples back to the two RF power amplifiers feeding the two or more coils. The impedance matching approach can also be used in impedance matching in semiconductor applications. Other applications are also contemplated herein.

Figure 1A:
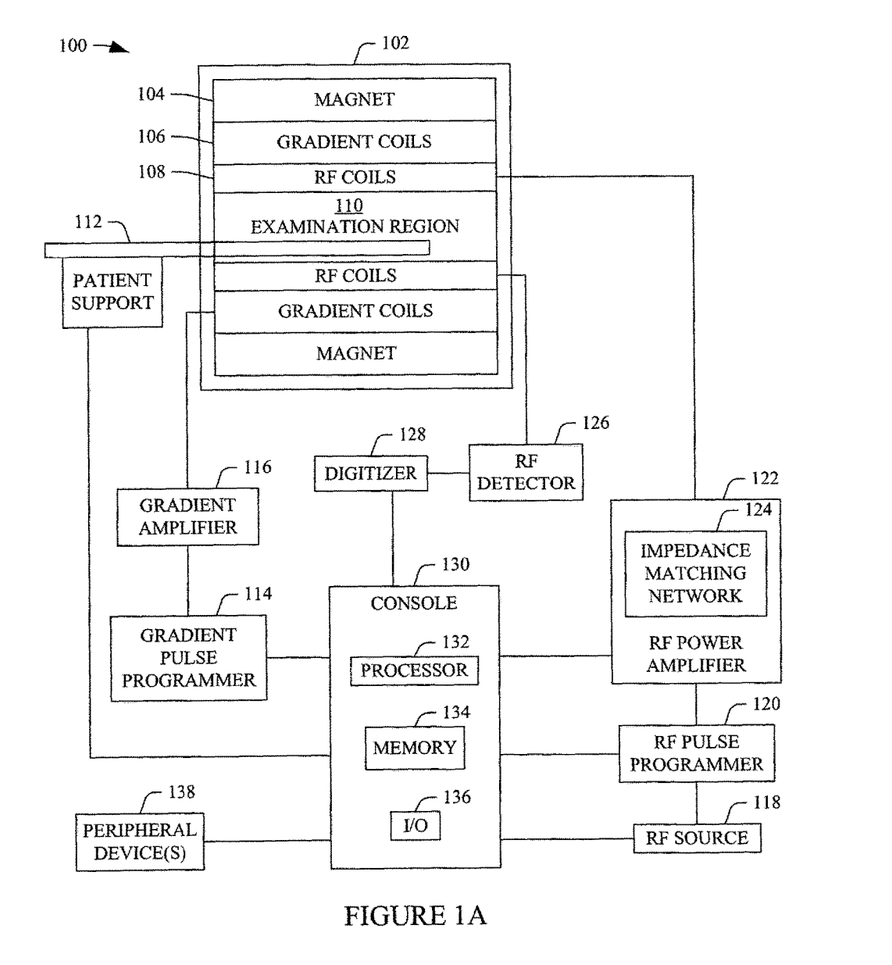
FIG. 1A schematically illustrates an example magnetic resonance imaging scanner, including an RF power amplifier with an impedance matching network.

FIG. 1A schematically illustrates an example MRI scanner system 100.

A gantry 102 includes a main magnet 104, gradient coils 106, RF coils 108, and an examination region 110 in a bore of the gantry 102. The main magnet 104, the gradient coils 106, and the RF coils 108 are typically located in a magnetically RF shielded enclosure (not visible). The scanner system 100 further includes a patient support 112, which facilitates placing and/or supporting a human or animal subject in the examination region 110.

The main magnet 104 surrounds the examination region 110 and produces a homogeneous, temporally constant main magnetic field $B_0$ in the examination region 110. Depending on the desired main magnetic field strength and the requirements of a particular application, various magnet technologies (e.g., superconducting, resistive, or permanent magnet technologies) and physical magnet configurations (e.g., solenoidal or open magnet configurations) can be employed.

The gradient coils 106 are disposed in a bore of the main magnet 104. The gradient coils 106 include x, y, and/or z-gradient coils, which generate time varying gradient magnetic fields along mutually orthogonal x, y, and z-axes. A gradient pulse programmer 114 determines a shape and amplitude of each of the x, y, and z gradient fields. A gradient amplifier 116 increases the power of the gradient pulses to a level sufficient to drive the gradient coils 106.

The RF coils 108 include an RF transmit coil that produces radio frequency signals which excite hydrogen or other magnetic resonant active nuclei in the object, and an RF receive coil that is located near a region of interest of the object and receives magnetic resonance signals generated by the excited nuclei. The transmit and receive coils can be combined in a single transceiver or separate coils. Examples of coils include surface coils, bird cage coils, Helmholtz pair coils, and/or other coils.

Figure 1B:
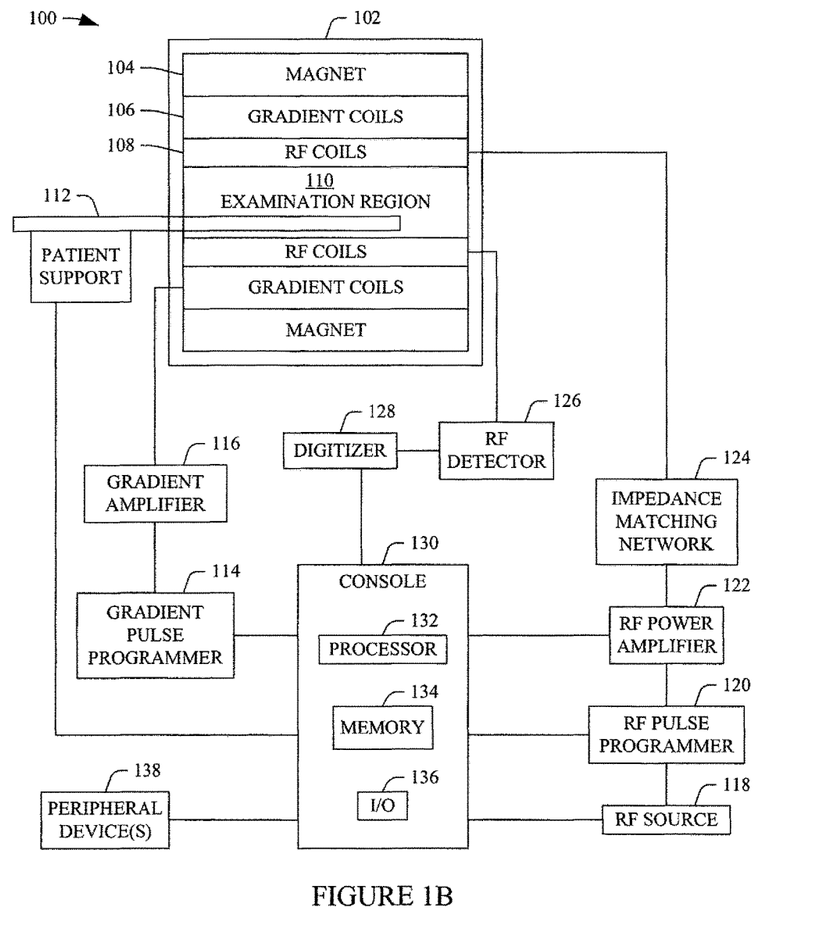
FIG. 1B schematically illustrates an example magnetic resonance imaging scanner where the RF power amplifier and the impedance matching network are separate devices.

An RF source 118 produces a sine wave of a desired frequency (e.g., the Larmor frequency of the MR active nuclei under investigation). A pulse programmer 120 shapes the sine wave into apodized sinc pulses. An RF power amplifier 122 increases a power of the pulses to the levels required by the RF transmit coil for exciting nuclei in the subject (e.g., from milliwatt (mW) to kilowatt (kW)). An impedance matching network 124 matches an output impedance of the RF power amplifier 122 to the load (i.e., the RF transmit coil). In the illustrated example, the impedance matching network 124 is part of the RF power amplifier 122. FIG. 1B shows a variation in which the impedance matching network 124 and the RF power amplifier 122 are separate entities.

As described in greater detail below, the impedance matching network 124 can include a plurality of discrete value pre-sets of capacitors that are switched in and out for different patient masses to match the output impedance of the RF power amplifier 122 to the RF transmit coil load impedance and/or the RF power amplifier 122 includes an adjustable direct current (DC) supply voltage, supplying DC voltage to the RF transistors of the RF amplifier, which is adjustable to change the output impedance of the RF power amplifier 122 to match the RF transmit coil load impedance. The impedance matching network can include an L, a T, or a PI topology. Also described below, the impedance matching network 124 can alternatively include motorized variable vacuum capacitors configured to directly select a discrete value to match the impedances.

The impedance matching approaches described herein can mitigate reflected power into the RF power amplifier 122, which will mitigate the power dissipated into the RF amplifier 122, relative to a configuration which omits the impedance matching approaches described herein. As an example, the maximum reflected power can be decreased to 10% or less. This can increase the mean time between failures (MTBF) for the RF power amplifier 122. It can also reduce the electric bill as the RF power amplifier 122 can be run with higher electric efficiency. Furthermore, this can mitigate a need for isolators/circulators, which can lower the Cost Of Goods Sold (COGS).

An RF detector 126 receives and amplifies the MR signals generated by the RF receive coil of the RF coils 108. A digitizer 128 digitizes the MR signals.

A computer serves as a console 130 and includes a hardware processor 132 (e.g., a central processing unit, or CPU, a micro-processor, a controller, etc.), memory 134 (i.e., a hardware device), and input/out (I/O) 136. The console 130 allows an operator to interact with the scanner system 100, for example, by selecting desired pulse sequences, a desired examination protocols, initiating and terminating scans, viewing and otherwise manipulating the volumetric data, and providing information such as subject mass to the RF power amplifier 122. The console 130 is configured to communicate with at least one or more of the RF power amplifier 122 and the impedance matching network 124.

The memory 134 stores imaging protocols, image reconstruction algorithms, visualization algorithms, etc., which are executable by the hardware processor 132. For example, the hardware processor 132 executes instructions stored on the memory 134 to process the digitized MR signals to generate volumetric imaging data. The I/O interfaces peripheral devices 138. The peripheral devices 138 include human perceptible input and output devices such as a keyboard, mouse, and display or monitor. Other peripheral devices 138 include a network interface, a computer, another imaging system, a data repository, a filmer, portable memory, etc.

Figure 2:
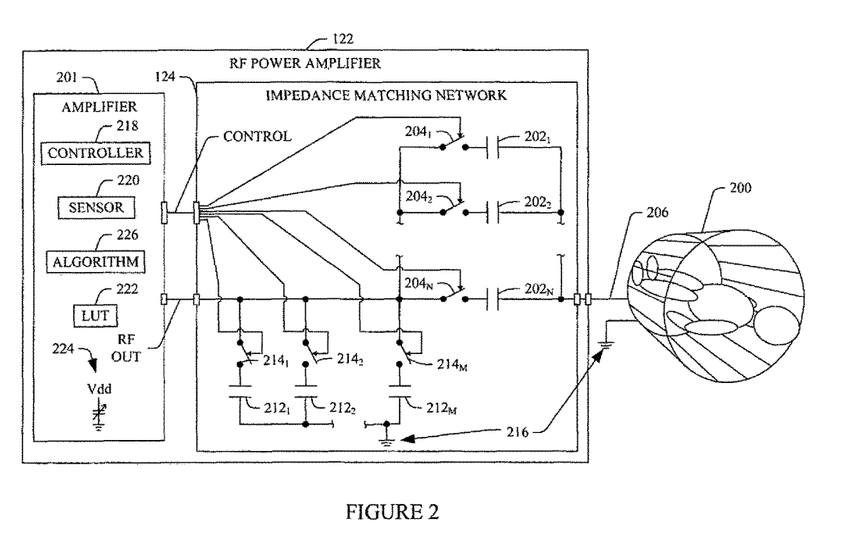
FIG. 2 schematically illustrates an example of the RF power amplifier with a variable DC supply voltage and the impedance matching network with switchable fixed capacitors in connection with an RF transmit coil.

FIG. 2 schematically illustrates an example of the RF power amplifier 122 of FIG. 1A in connection with an RF transmit coil 200 of the RF coils 108. In this example, the impedance matching approach uses a fixed set of discrete presets of series and parallel capacitor circuits, which are switched in and out of the circuit depending on the load impedance seen by the RF power amplifier 122, and/or varies a variable DC supply voltage of the RF power amplifier 122 for impedance matching or for refining the impedance matching of the discrete presets.

The impedance matching network 124 includes a bank of N fixed capacitance capacitors $202_1$, $202_2$, ... $202_N$ in parallel (referred to herein as series capacitor 202), where N is a positive integer. A first side of the series capacitor 202 is respectively electrically connected to a first side of switches $204_1$, $204_2$, ... $204_N$ (referred to herein as series switches or switches 204). A second side of the series capacitor 202 is electrically connected to a first electrode or terminal 206 of the RF transmit coil 200 (which is a birdcage coil in this example) of the RF coils 108. A second side of series switches 204 is electrically connected to an output of the RF power amplifier 122.

The impedance matching network 124 further includes a bank of M fixed capacitance shunt capacitors $212_1$, $212_2$, ... $212_M$ (referred to herein as shunt/parallel capacitor 212), where M is a positive integer, and N=M or N≠M. A first side of the shunt/parallel capacitor 212 is respectively electrically connected to a first side of switches $214_1$, $214_2$, ... $214_M$ (referred to herein as shunt switches or switches 214). A second side of the shunt/parallel capacitor 212 is electrically connected to electrical ground 216. A second side of the shunt switches 214 is electrically connected to the output of the RF power amplifier 122.

The RF power amplifier 122 includes an amplifier 201 with a controller 218, which includes a processor (not visible) and memory (not visible) that stores instructions. The output of the controller 218 is electrically connected to each of the series switches 204 and shunt switches 214, and controls a state of the switches 204 and 214 (i.e., opened or closed). The controller 218 is configured to dynamically control (i.e., open or close) the switches 204 and 214 to switch capacitors of the capacitors 202 and/or 212 in and out of the circuit based on the load impedance. The switches 204 and 214 can be implemented via PIN diodes and/or other RF switches.

An impedance/power sensor 220 of the RF power amplifier 122 measures forward and/or reflected power. The controller 218 employs the measured reflected power to control the switches 204 and 214. In one instance, this includes a fully automated approach in which the controller 218 compares the measured reflected power with a predetermined threshold range and automatically changes the state of the capacitors 202 and 212 to one of multiple presets if the measured reflected power does not satisfy the predetermined threshold range. The impedance/power sensor 220 then measures the reflected power again, and the controller 218 repeats the comparison and change, if needed. This process continues until the measured reflected power satisfies the predetermined threshold range.

Another approach includes a semi-automated approach. For this approach, a customer takes patient size (e.g., height and weight) measurements and coil impedance measurements for a plurality of different patient sizes. The patient size/coil impedance measurement pairs are stored in a look-up table (LUT) 222 and linked to an index or keyword (e.g., size 1, size 2, ..., size N). An operator of the scanner, via the console 130, selects a patient size of interest for a patient to be scanned, e.g., from a list of available patient sizes (size 1, size 2, ..., size N) visually presented in a graphical user interface and/or other software application executing on the console 130. The console 130 transmits a signal indicating the selected patient size to the controller 218, which controls the switches 204 and 214 using the LUT 222 by locating the selected patient size in the LUT 222, retrieving the coil impedance corresponding to the patient size, and setting the switches to a preset for a range covering the coil impedance.

With another approach, the controller 218 compares the measured impedance with a pre-set load impedance stored in the memory of the controller 218. The stored pre-set load impedance (e.g., 50 Ohms), in one instance, corresponds to an "average" patient size. The controller 218, depending on a difference between the measured and pre-set load impedance, automatically sends control signals to open a certain set of capacitors and/or close another certain set of capacitors. The particular set of capacitors to open and close may be determined, e.g., from the LUT 222, which, in this case, maps impedances differences (mismatches) and/or impedances difference (mismatch) ranges to a pre-determined configuration of open and closed switches, and/or otherwise. The measured impedance, in general, indicates if there is a load mismatch condition due to a variation in a patient mass of the patient being scanned relative to the pre-set load impedance (e.g., 50 Ohm) for the "average" patient mass.

The LUT 222, in this instance, is configured so that a measured impedance corresponding to the "average" patient mass identifies a switch configuration in which the power of the RF power amplifier 122 will be routed straight to the first terminal 206 of the RF transmit coil 108. That is, all of the capacitors will be by-passed (e.g., placed in open state). For example, the capacitor $202_1$ can be removed and replaced with a short-circuit so that the switch $204_1$ connects the output of the RF power amplifier 122 directly to the terminal 206. The LUT 222 identifies a different switch configuration for a measured impedance corresponding to a larger mass, and still another different configuration for a measured impedance corresponding to a smaller mass.

The amplifier 201 further includes a variable DC supply voltage (Vdd) 224 on a drain/collector of RF transistor. The controller 218 compares the reflected power at the output of the RF power amplifier 122, after the capacitors of the impedance matching network 124 are switched according to the selected pre-set, with impedance minimum reflected power threshold. If the reflected power at the output of the RF power amplifier 122 is outside of a predetermined tolerance (e.g., ±15%, etc.) about the forward power, the controller 218 adjusts Vdd 224 until the reflected power at the output of the RF power amplifier 122 is within the tolerance. The variable DC supply voltage Vdd 224 is adjusted based on an algorithm 226. An example algorithm that can be used to find the optimum DC supply voltage uses a modified bisection minima search routine or a similar routine to find the lowest reflected power point.

For example, if the reflected power at the output of the RF power amplifier 122 is outside of the tolerance, Vdd 224 is varied. As the drain/collector voltage Vdd 224 is varied, the output impedance of the RF power amplifier 122 varies. The variable output impedance of the RF power amplifier 122 can be represented through the complex relationship $Z=R-jX$, where Z represents impedance, R represents resistance and X represents reactance. If the output impedance of the RF power amplifier 122 is within the tolerance, Vdd 224 is not varied.

Figure 3:
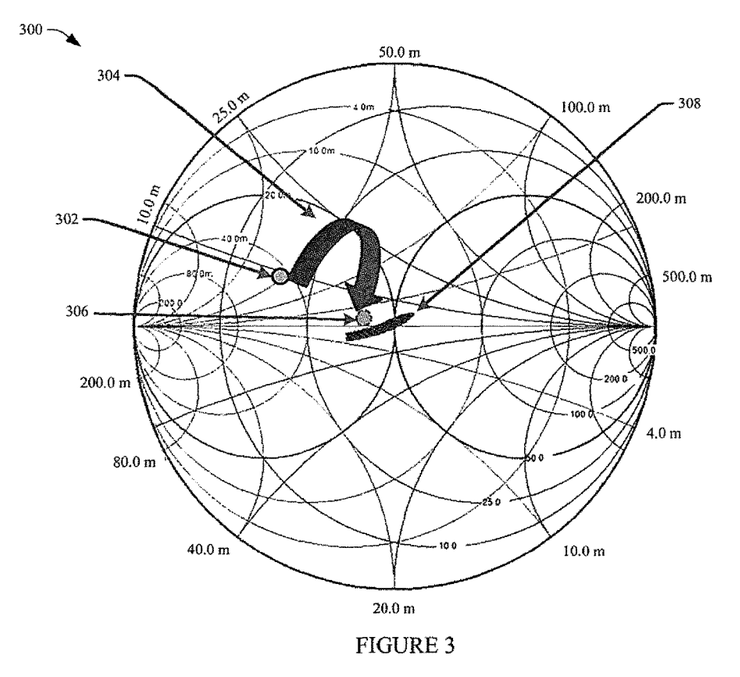
FIG. 3 graphically illustrates the effect of the impedance matching network and the variable DC supply voltage with a Smith chart.

The effect of the variable DC supply voltage 224 and/or the switchable output capacitor array of the impedance matching network 124 is shown graphically in a Smith chart 300 in FIG. 3. The Smith chart 300 shows an example of a load impedance 302, e.g., for a default load impedance. In this example, the default load impedance 302 is not matched or is unmatched to the load for a size of a current patient. The Smith chart 300 shows at 304 that switching the switchable capacitors 202 and 212 (FIG. 2) for the current patient size translates a whole range of the load impedance coverage to a different area 306 in the Smith chart 300. The Smith chart 300 also shows a fine adjustment range 308 about the area 306 of the output impedance of the RF power amplifier 122 as a function of varying the drain/collector voltage.

Returning to FIG. 2, the console 130 can provide information such as subject mass, weight, size, etc., via user input and/or otherwise, to the RF power amplifier 122, if needed.

In general, this impedance matching approach uses a fixed set of discrete presets of series and shunt/parallel capacitors 212, which are switched in and out of the circuit depending on the load impedance seen by the RF power amplifier 122. A variable DC supply voltage 224 on the RF power amplifier 122 is varied to refine the impedance matching.

In another variation, the impedance matching network 124 is omitted and only the variable DC supply voltage 224 is varied to match the output impedance of the RF power amplifier 122 to the load impedance.

In another variation, the DC supply voltage 224 is not variable or not varied, and only the impedance matching network 124 is used to match the output impedance of the RF power amplifier 122 to the load impedance.

Figure 10:
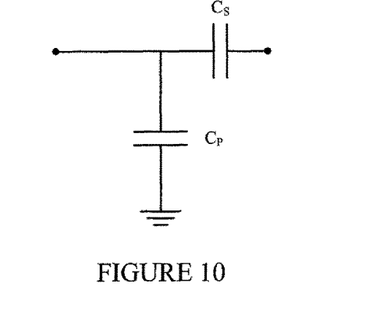
FIG. 10 schematically illustrates an example L-section matching network.
Figure 11:
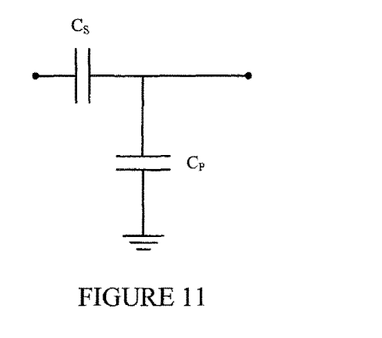
FIG. 11 schematically illustrates an example inverse L-section matching network.
Figure 12:
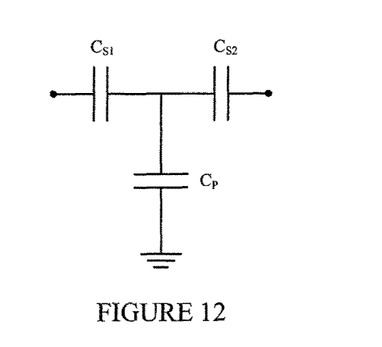
FIG. 12 schematically illustrates an example T-section matching network.
Figure 13:
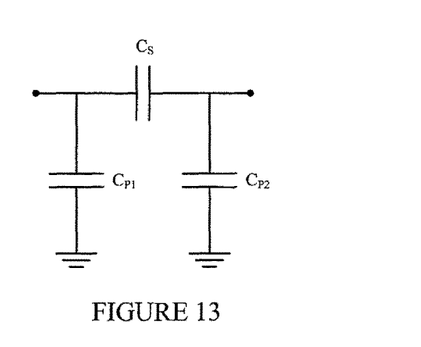
FIG. 13 schematically illustrates an example PI-section matching network.

The illustrated example depicts the capacitors in an L configuration. In a variation, the capacitors are alternatively in a reversed L configuration. In another variation, the capacitors are alternatively in a T configuration. In another variation, the capacitors are alternatively in a PI configuration. FIGS. 10, 11, 12 and 13 respectively show examples of the different matching topologies. FIG. 10 shows an L configuration, FIG. 11 shows a reversed L configuration, FIG. 12 shows a T configuration, and FIG. 13 shows a PI configuration. In these examples, the subscript "s" refers to a series capacitor and the subscript "p" refers to a shunt/parallel capacitor. In a variation, one or more of the topologies also includes a series inductor.

Figure 4:
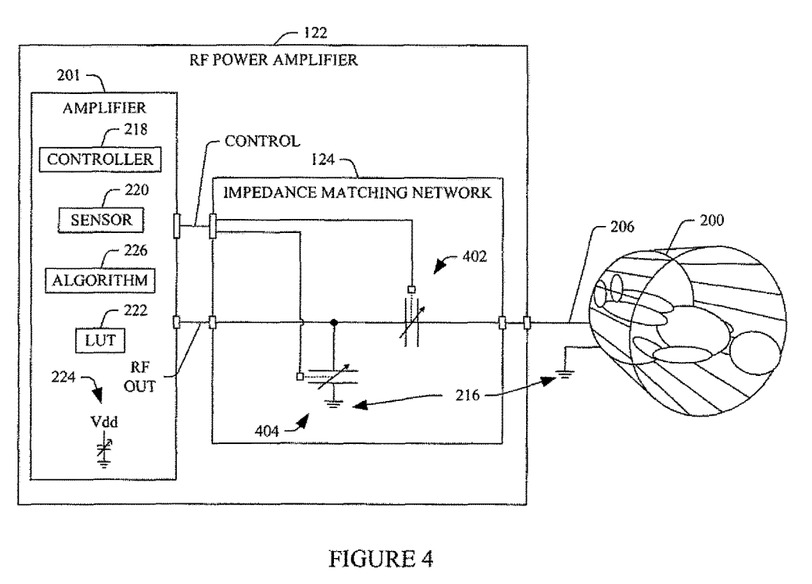
FIG. 4 schematically illustrates an example of the RF power amplifier with the variable DC supply voltage and the impedance matching network with motorized capacitors in connection with the RF transmit coil.

FIG. 4 schematically illustrates another example of the RF power amplifier 122 in connection with a load of the RF transmit coil 200 of the RF coils 108. In this example, the amplifier 201 and the RF transmit coil 200 are the same as in FIG. 2, and the impedance matching network 124 is different. The impedance matching network 124 in this example employs motorized series and shunt capacitors 402 and 404 for switching between the fixed pre-sets. The motorized series and shunt capacitors 402 and 404 are configured to move the capacitance to the optimum preset capacitance value for minimum reflected power condition. The motor goes directly to a pre-set capacitor value, even though the capacitor has a continuous range, and does not go through continuous motion in a search algorithm looking for a point in which the output impedance of the amplifier is matched to the load impedance.

Another embodiment includes a combination of the fixed capacitors of FIG. 2 and the motorized capacitors of FIG. 4.

Figure 5:
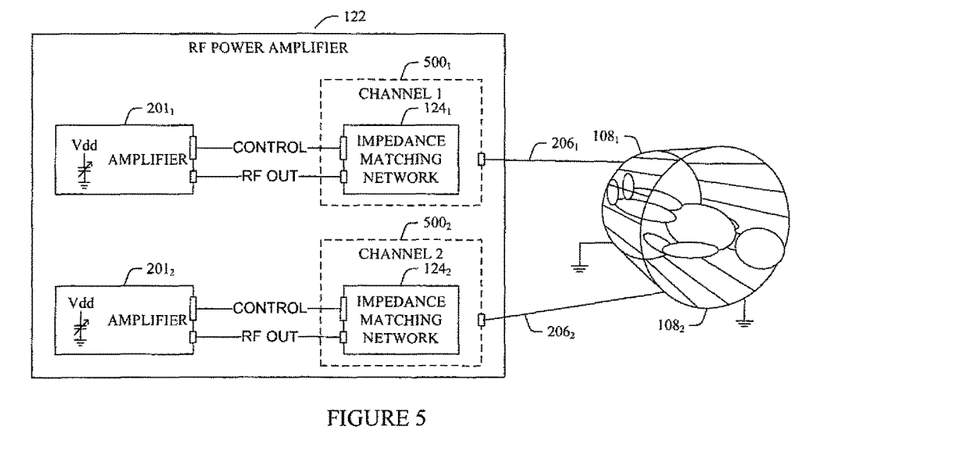
FIG. 5 schematically illustrates an example of the impedance matching network in a two channel MRI system.

FIG. 5 schematically illustrates an example two-channel MRI system. In this example, the RF transmit coil 108 is divided into first and second coils $108_1$ and $108_2$ having first and second amplifiers $201_1$ and $201_2$, respectively. A first amplifier $201_1$ and a first impedance matching network $124_1$ of a first channel $500_1$ ("CHANNEL 1") are in electrical communication with the first terminal $206_1$. A second amplifier $201_2$ and a second impedance matching network $124_2$ of a second channel $500_2$ ("CHANNEL 2") are in electrical communication with the second terminal $206_2$. The first and second coils $108_1$ and $108_2$ are controlled independently respectively by the amplifier/first impedance matching network pairs for phase and amplitude, e.g., for better B-field uniformity. The first and second terminals $206_1$ and $206_2$ are substantially similar to the amplifier 201 described in connection with FIG. 2, and the first and second impedance matching networks $124_1$ and $124_2$ are substantially similar to the impedance matching network 124 described in connection with FIG. 2.

Figure 6:
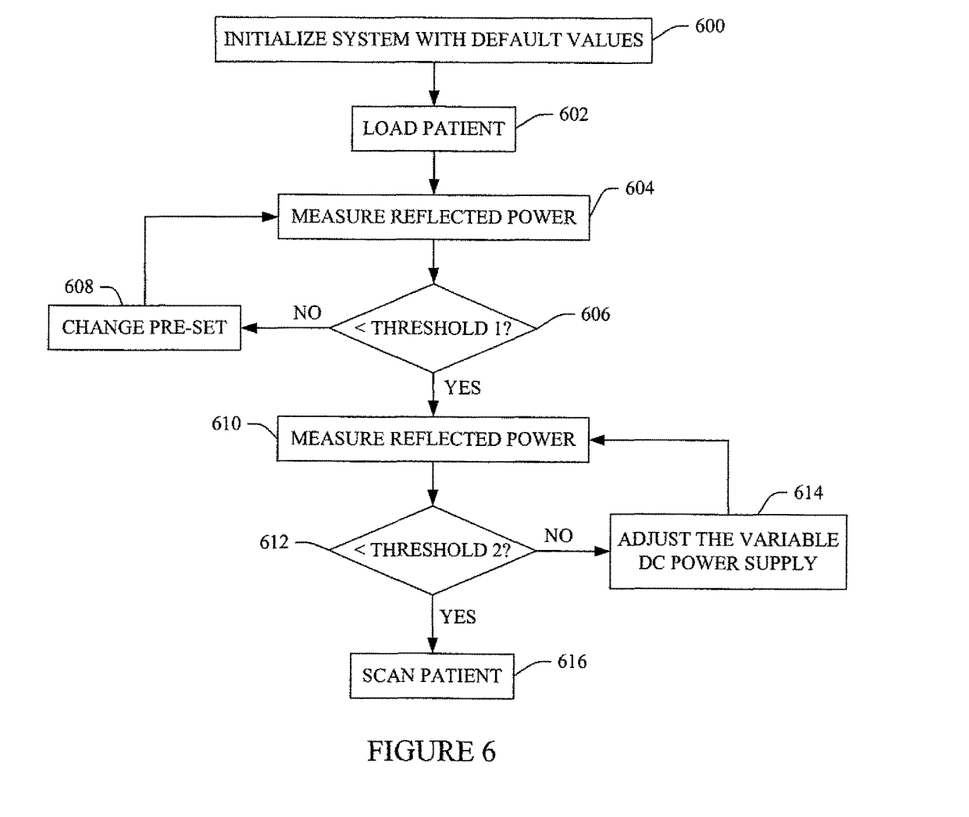
FIG. 6 illustrates a method in accordance with an embodiment herein.

FIG. 6 illustrates a method in accordance with an embodiment herein.

It is to be understood that the following acts are provided for explanatory purposes and are not limiting. As such, one or more of the acts may be omitted, one or more acts may be added, one or more acts may occur in a different order (including simultaneously with another act), etc.

At 600, the RF power amplifier 122 is initialized by the scanner system 100. This may include initializing the RF power amplifier 122 with a default or nominal Vdd 224 and a default capacitance pre-set. This may occur when the scanner system 100 is first turned on for the day, before and/or after scanning a patient, upon rebooting the console 130, etc.

At 602, a patient is loaded in the MRI system 100 for scanning.

At 604, a reflected power is measured, as described herein and/or otherwise. In this embodiment, the reflected power is constantly measured.

At 606, it is determined if the measured reflected power is lower than a first predetermined threshold value or range.

If the measured reflected power is not lower than the first predetermined range, then at 608 software internal to the RF power amplifier 122 changes the preset capacitor configuration for the impedance matching network 124, and acts 604 and 606 are repeated.

If the measured reflected power is lower than the first predetermined range, then at 610, a reflected power is measured, as described herein and/or otherwise. Again, in this embodiment the reflected power is constantly measured.

At 612, it is determined if the measured reflected power is lower than a second predetermined threshold value or range.

If the measured reflected power is not lower than the second predetermined threshold value or range, then at 614 software internal to the RF power amplifier 122 varies the variable DC power supply Vdd 224, as described herein and/or otherwise, and acts 610 and 612 are repeated.

If the measured reflected power is lower than the second predetermined range, then at 616, the capacitor presets and the supply voltage VDD are fixed and not allowed to change, and the patient is scanned.

In one non-limiting instance, acts 604-614 are completed in less than 500 milliseconds (ms), such as 250-300 ms, 100-200 ms, etc.

As described herein, in one instance acts 604 to 608 are omitted, and in another instance acts 610 to 614 are omitted.

Figure 7:
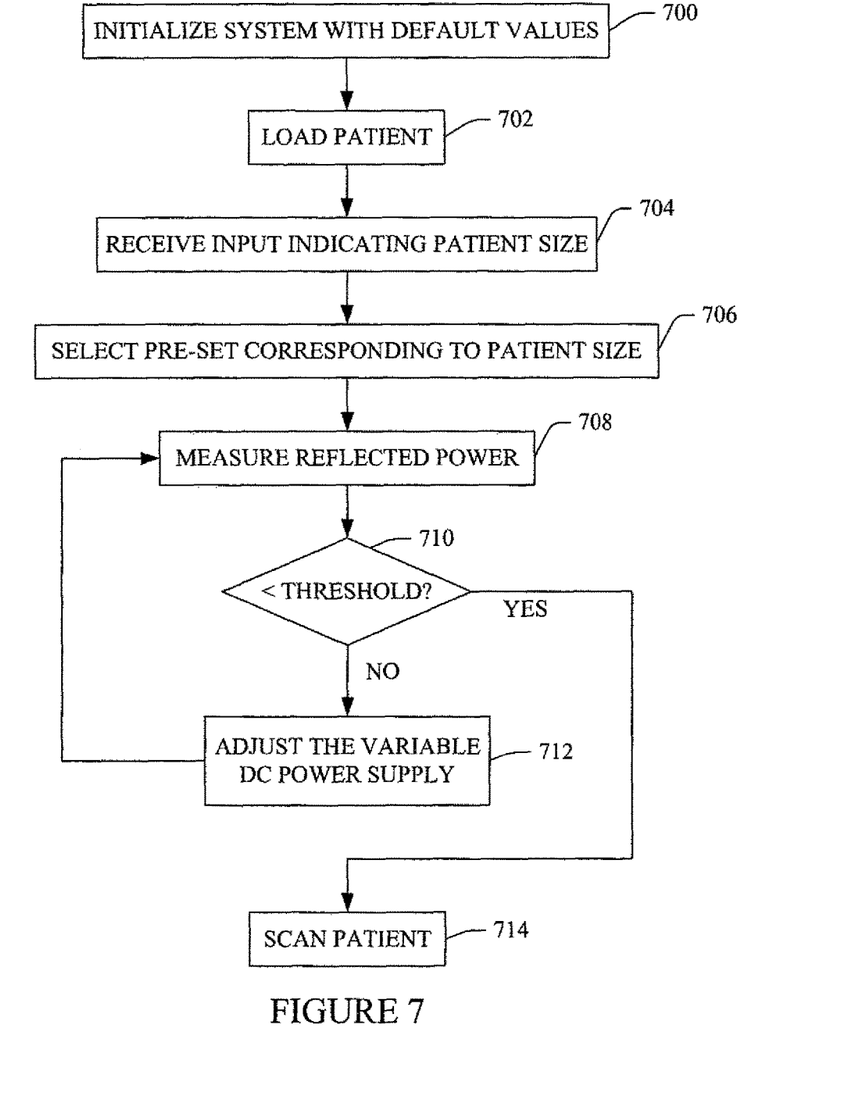
FIG. 7 illustrates another method in accordance with an embodiment herein.

FIG. 7 illustrates another method in accordance with an embodiment herein.

It is to be understood that the following acts are provided for explanatory purposes and are not limiting. As such, one or more of the acts may be omitted, one or more acts may be added, one or more acts may occur in a different order (including simultaneously with another act), etc.

At 700, the RF power amplifier 122 is initialized by the scanner system 100. This may include initializing the RF power amplifier 122 with a default or nominal Vdd 224 and a default capacitance pre-set. This may occur when the scanner system 100 is first turned on for the day, before and/or after scanning a patient, upon rebooting the console 130, etc.

At 702, a patient is loaded in the MRI system 100 for scanning.

At 704, the scanner system 100 receives an input indicating a patient size, as described herein and/or otherwise.

At 706, the scanner system 100 selects a pre-set capacitor configuration for the impedance matching network 124 corresponding to the patient size.

At 708, a reflected power is measured, as described herein and/or otherwise.

At 710, it is determined if the measured reflected power is lower than a predetermined threshold value or range.

If the measured reflected power is not lower than the first predetermined range, then at 712 software internal to the RF power amplifier 122 varies the variable DC power supply Vdd 224, as described herein and/or otherwise, and acts 708 and 710 are repeated.

If the measured reflected power is lower than the second predetermined range, then at 714, the patient is scanned.

In one non-limiting instance, acts 708-712 are completed in less than 200 ms, such as 125-175 ms, 50-100 ms, etc.

As described herein, in one instance act 704 to 708 are omitted, and in another instance acts 708 to 712 are omitted.

Figure 8:
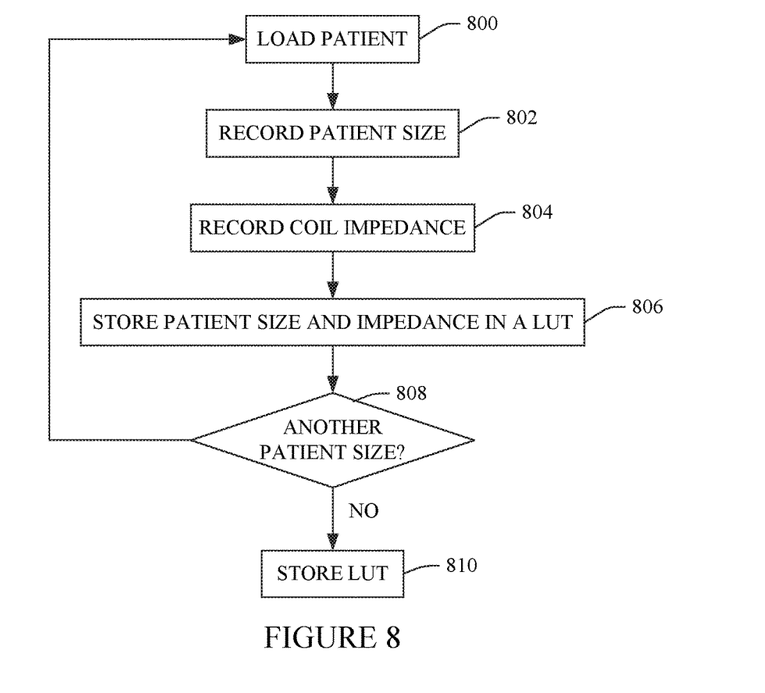
FIG. 8 illustrates a method to create the LUT in accordance with an embodiment herein.

FIG. 8 illustrates an example that works in conjunction with the system in FIG. 7 for creating a LUT that matches input patient size to pre-set capacitor configuration.

At 800, the RF power amplifier 122 is initialized by the scanner system 100. This may include initializing the RF power amplifier 122 with a default or nominal Vdd 224 and a default capacitance pre-set. This may occur when the scanner system 100 is first turned on for the day, before and/or after scanning a patient, upon rebooting the console 130, etc.

At 800, a patient is loaded in the MRI system 100 for scanning.

At 802, a size of the patient is measured and recorded.

At 804, an impedance of the coil is measured and recorded.

At 806, the patient size and coil impedance pair are stored in the LUT.

At 808, it is determined if another pair is to be added to the LUT. If so, then acts 800-808 are repeated.

If not, then at 810, the LUT is stored, e.g., in the scanner system 100.

Figure 9:
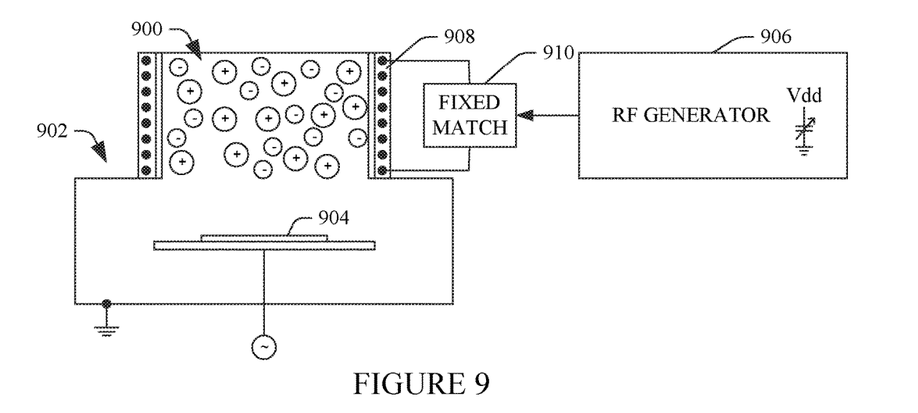
FIG. 9 schematically illustrates an example of an RF power amplifier in connection with inductively coupled plasma.

FIG. 9 schematically illustrates an example in connection with Inductively Coupled Plasma (ICP). In semiconductor manufacturing application, specially inductively coupled plasma high density plasma is created by highly accelerating gas molecules 900 in a plasma chamber 902 to ionize the gas molecules 900. These ions are a main source of bombardment of a wafer 904 in plasma dry etch applications. An RF generator 906 provides high power to a coil 908 in the ICP application. In the illustrated example, a matching network 910 (e.g., the impedance matching network 124) is between the RF generator 906 (e.g., the RF power amplifier 122) and the coil 908.

This approach facilitates providing maximum power transfer between the RF generator 906 and the chamber coil 908. The fixed matching network 910 can be in an L, a T, or a PI configuration in conjunction with the RF generator 906, which includes a variable DC supply as described herein to match an output impedance of the amplifier to the coil impedance for maximum power transfer between the amplifier and the coil. In a variation, a variable frequency amplifier with a variable DC supply can be used to increase the impedance matching range of the RF amplifier.

The application has been described with reference to various embodiments. Modifications and alterations will occur to others upon reading the application. It is intended that the invention be construed as including all such modifications and alterations, including insofar as they come within the scope of the appended claims and the equivalents thereof.

What is claimed is:

1. An apparatus, comprising:
   an RF power amplifier that includes a controller and a variable DC power supply, wherein the controller is configured to drive a load in electrical communication with the RF power amplifier; and
   an impedance matching network that is located electrically between the RF power amplifier and the load and that is configured to match an output impedance of the RF power amplifier and an impedance of the load,
   wherein the impedance matching network includes a set of fixed value impedance matching circuits configured to provide different discrete values,
   wherein the controller selects an impedance matching circuit to match the output impedance of the RF amplifier to the load impedance; and
   wherein the controller varies the variable DC power supply to match the output impedance of the RF power amplifier and the impedance of the load, only in response to the impedance matching network failing to satisfy a pre-determined threshold about a reflected power at an output of the RF amplifier.

2. The apparatus of claim 1, wherein the set of fixed value impedance matching circuits includes a set of series capacitors, a set of shunt capacitors, and a set of switches, wherein the set of switches is configured to selectively electrically connect one or more capacitors and selectively electrically disconnect one or more capacitors of the set of discrete value impedance matching circuits.

3. The apparatus of claim 2, wherein the set of series and shunt capacitors includes a fixed capacitance value capacitor.

4. The apparatus of claim 2, wherein the controller varies the variable DC power supply to match the output impedance of the RF power amplifier and the impedance of the load only after the set of switches are set and fail to satisfy the pre-determined threshold about the reflected power at the output of the RF amplifier.

5. The apparatus of claim 1, wherein the set of fixed value impedance matching circuits includes a motorized variable vacuum capacitor that moves between a set of fixed discrete capacitance values, each corresponding to a different one of the discrete value impedance matching circuits.

6. The apparatus of claim 5, wherein the controller controls the set of fixed value impedance matching circuits to move directly to a fixed capacitance value to minimize the measured reflected power at the output of the RF amplifier.

7. The apparatus of claim 5, wherein the controller varies the variable DC power supply to match the output impedance of the RF power amplifier and the impedance of the load only after a discrete value of the set of fixed discrete capacitance values is set and fails to satisfy the pre-determined threshold about the reflected power at the output of the RF amplifier.

8. The apparatus of claim 1, wherein the RF power amplifier comprise an impedance/power sensor configured to measure forward and reflected power at the output of the RF amplifier.

9. The apparatus of claim 1, wherein the impedance matching network is enclosed within a housing of the RF power amplifier.

10. The apparatus of claim 1, wherein the impedance matching network is external to the RF power amplifier and configured to interface with the RF power amplifier.

11. An apparatus, comprising:
an RF power amplifier configured to drive a load in electrical therewith, the RF power amplifier including:
an impedance/power sensor configured to measure an impedance of the load or the forward and reflected power at the output of the RF amplifier;
a variable DC power supply;
a controller in electrical communication with the sensor and the power supply,
wherein the controller varies a level of the variable DC power supply based on the impedance of the load to match an output impedance of the RF power amplifier and the impedance of the load; and
an impedance matching network located electrically between the RF power amplifier and the load and configured to match the output impedance of the RF power amplifier and the impedance of the load before the controller varies the level of the variable DC power supply,
wherein the impedance matching network includes a plurality of fixed value configured to selectively add or remove a predetermined capacitance from a set of predetermined capacitances to and from the impedance matching network.

12. The apparatus of claim 11, wherein the load is an RF transmit coil of an MRI system.

13. The apparatus of claim 12, wherein the load is a birdcage RF transmit coil.

14. The apparatus of claim 11, wherein the impedance matching network includes an L impedance matching section, a reversed L impedance matching section, a T impedance matching section, a PI impedance matching section, or a combination of the L, reversed L, T, and PI impedance matching sections.

15. The apparatus of claim 11, wherein the impedance matching network includes a motorized capacitor configured to move directly to a fixed capacitance value of a set of predetermined fixed capacitance values.

16. An apparatus, comprising:
an RF power amplifier configured to drive a load in electrical therewith, the RF power amplifier including:
an impedance/power sensor configured to measure an impedance of the load or the forward and reflected power at the output of the RF amplifier;
a variable DC power supply; and
a controller in electrical communication with the sensor and the power supply,
wherein the controller varies a level of the variable DC power supply based on the impedance of the load to match an output impedance of the RF power amplifier and the impedance of the load; and
an impedance matching network located electrically between the RF power amplifier and the load and configured to match the output impedance of the RF power amplifier and the impedance of the load before the controller varies the level of the variable DC power supply,
wherein the impedance matching network includes a motorized capacitor configured to move directly to a fixed capacitance value of a set of predetermined fixed capacitance values.

* * * * *

UNITED STATES PATENT AND TRADEMARK OFFICE
CERTIFICATE OF CORRECTION

PATENT NO. : 10,148,231 B2
APPLICATION NO. : 15/181523
DATED : December 4, 2018
INVENTOR(S) : Ahmed A. Hussein et al.

Page 1 of 1

It is certified that error appears in the above-identified patent and that said Letters Patent is hereby corrected as shown below:

In the Specification
Column 9,    Line 25,    change "act 704 to 708" to --acts 704 to 708--

Signed and Sealed this
First Day of January, 2019

Andrei Iancu
*Director of the United States Patent and Trademark Office*